United States Patent
Triller et al.

(10) Patent No.: US 6,313,401 B1
(45) Date of Patent: Nov. 6, 2001

(54) THERMALLY STABLE ACTUATOR/SENSOR STRUCTURE

(75) Inventors: Michael J. Triller, Hermosa Beach; Christopher W. Felts, Lakewood; Kathleen M. Doherty; Lisa R. Hill, both of Rancho Palos Verdes; Craig A. Lavinsky, Manhattan Beach, all of CA (US)

(73) Assignee: TRW Inc., Redondo Beach, CA (US)

( * ) Notice: Subject to any disclaimer, the term of this patent is extended or adjusted under 35 U.S.C. 154(b) by 0 days.

(21) Appl. No.: 09/216,151

(22) Filed: Dec. 18, 1998

(51) Int. Cl.$^7$ ............................. H01L 23/28; H05K 5/06
(52) U.S. Cl. ........................................ 174/52.2; 257/790
(58) Field of Search .................. 174/52.2, 52.3, 174/52.4; 257/787, 788, 789, 790, 791, 792, 793, 794, 795

(56) References Cited

U.S. PATENT DOCUMENTS 4,979,019 * 12/1990 Paquette et al. ..................... 251/747
5,305,507    4/1994 Dvorsky et al. ..................... 29/25.35

* cited by examiner

Primary Examiner—Dean A. Reichard
Assistant Examiner—Hung V Ngo
(74) Attorney, Agent, or Firm—Noel F. Heal

(57) ABSTRACT

A singly or doubly encapsulated actuator/sensor package in which a ceramic actuator/sensor (10) may be first encapsulated in a primary encapsulating material (12) and is encapsulated in a fiber-reinforced composite material (20, 22). A combination of the material and ply angles ($\theta$) of the fiber-reinforced composite material (20, 22) are used to control selection of a composite coefficient of thermal expansion (CTE) and the stiffness or compliance of the package with respect to a selected axis. By optimal selection of the material and the ply angle, based upon a suitable actuation strength figure of merit, a CTE of zero or a CTE matching that of an underlying structural member (24) is obtained, while simultaneously maximizing the actuation strength in a selected actuation direction. Application of the invention to precision structures permits the underlying structures to be designed with very low stiffness, because precise, thermally stable, pointing or shaping actuation forces may be obtained in a thermally stable manner.

10 Claims, 2 Drawing Sheets

THERMALLY STABLE ACTUATOR/SENSOR STRUCTURE

BACKGROUND OF THE INVENTION

This invention relates generally to actuators and sensors used in precision spacecraft structures and, more particularly, to techniques for minimizing the effects of temperature changes on such structures. It is well known that certain materials exhibit a piezoelectric or electrostrictive effect and may be used as actuators, wherein an applied electric field causes mechanical strain or deformation along a selected axis of the material. An inverse effect allows strain to be sensed as a generated electrical signal. Devices of this type are especially useful in space applications, such as for vibration suppression, vibration isolation, active damping, health monitoring and shape control. Actuators or sensors can be conveniently incorporated into "host" structural members as implants or as patches applied externally.

A well recognized difficulty in any precision application of ceramic piezoelectric or electrostrictive sensors and actuators is that the actuator/sensor material may have a non-zero coefficient of thermal expansion (CTE) that does not match the CTE of the host structural element. This mismatch of CTEs can cause unwanted bending or other strain in the host structure, and can cause errors in sensed strains in the structure. U.S. Pat. No. 5,305,507 issued to George R. Dvorsky et al., entitled "Method for Encapsulating a Ceramic Device for Embedding in Composite Structures," discloses a technique for encapsulating an actuator/sensor using a piezoelectric ceramic material, such as lead zirconate titanate (PZT) or lead magnesium niobate (PMN) (ceramic). Basically, the technique disclosed in the Dvorsky et al. patent is to design the encapsulating material to provide strain relief to offset the brittleness of the ceramic actuator and to provide electrical isolation for the ceramic actuator and leads. The effect of encapsulation, however, resulted in an actuator/sensor that has a net positive CTE. For applications requiring high precision, thermal distortion of structures must be limited or highly controlled. Temperature changes produce expansion or contraction when non-zero CTEs are present, and mismatching of CTEs can cause unwanted structural bending.

The present invention focuses on minimizing the net encapsulant CTE or matching the net encapsulant CTE to that of the host structure. An additional desire is to simultaneously maximize the actuation strength using a suitable figure of merit. The net result is a thermally stable sensor/actuator package.

In general, negative CTE materials are accompanied by high modulii. A practitioner skilled in the art recognizes that the steps taken to minimize the CTE reduce the actuation strength. That is, alignment of the high modulus fibers in the direction of desired low CTE results in increased stiffness. Maximization of actuation strength competes against this objective by requiring decreased stiffness. An important objective of this invention is to optimize both characteristics: CTE and actuation strength.

SUMMARY OF THE INVENTION

The present invention resides in a thermally stable actuator/sensor package for use in a host structural member. Briefly, and in general terms, the invention in one of its disclosed embodiments may be defined as a doubly encapsulated actuator/sensor package, comprising a ceramic piezoelectric or electrostrictive actuator/sensor having wire leads connected to electrodes of the actuator sensor; a primary encapsulating material surrounding the actuator/sensor except for the wire leads, which extend through the primary encapsulating material; and a secondary encapsulating material surrounding the primary encapsulating material and comprising multiple plies of a fiber-reinforced composite material applied to the primary encapsulating material at selected ply angles. The fiber-reinforced composite material and the ply angles are selected to provide a desired net coefficient of thermal expansion and a desired stiffness with respect to a selected axis.

More specifically, the primary and secondary encapsulating materials and the secondary encapsulating material ply angle are selected to provide a net coefficient of thermal expansion of approximately zero, or a coefficient of thermal expansion matching a specific structural material in which the package is to be adhered to or imbedded within. The selected fiber-reinforced composite material ply angle also results in a composite structure of sufficiently low stiffness to provide desirably high actuator force and sensor signal strength.

In the presently preferred embodiment of the invention, the actuator/sensor is of lead zirconate titanate (ceramic) material. The related method equally applies to the previously mentioned electrostrictive ceramics, such as lead magnesium niobate (PMN). The primary encapsulating material is a non-conductive fiber-reinforced composite material and a resin system; and the secondary encapsulating material is a fiber-reinforced composite material. In one specific form of the invention, the ply angle is in the range of approximately thirty to forty degrees with respect an axis in which strain occurs in the actuator/sensor package when in use.

The same principles used for secondary encapsulation may be used in a singly encapsulated embodiment of the invention. In this embodiment, an actuator/sensor is encapsulated in a fiber-reinforced composite material. The encapsulating material and the ply angle at which the material is applied are selected to provide a desired coefficient of thermal expansion and a desired stiffness with respect to a selected direction of strain.

The invention may also be defined as a method of making an encapsulated ceramic actuator/sensor package having a desired coefficient of thermal expansion and a desired stiffness. For double encapsulation, the method comprises the steps of encapsulating a ceramic actuator/sensor in a primary encapsulating material, except for a pair of contact leads extending through the encapsulating material; selecting a fiber-reinforced composite material and a fiber-reinforced composite material ply angle to provide a desired net coefficient of thermal expansion and a desired stiffness with respect to a selected direction of strain; and encapsulating the actuator/sensor and the primary encapsulating material in the fiber-reinforced composite material to form a composite package with the desired coefficient of thermal expansion and the desired stiffness with respect to the selected direction of strain. For single encapsulation, primary encapsulation uses a selected fiber-reinforced composite material and a selected ply angle to provide the desired coefficient of thermal expansion and the desired stiffness with respect to the selected direction of actuation.

More specifically, each of the encapsulating steps includes applying a fiber-reinforced composite material, and then curing material to complete the encapsulation. Further, the step of applying the fiber-reinforced composite material when encapsulating with the secondary encapsulating material includes applying the fiber-reinforced composite material as generally parallel plies, at the selected ply angle with respect to the selected actuation direction.

The invention may also be defined as a method of optimizing the performance of an encapsulated actuator/sensor package, comprising the steps of minimizing the net encapsulant coefficient of thermal expansion (CTE), or matching the CTE to that of a host structure, and simultaneously maximizing the net encapsulant actuation strength, by optimal selection of the encapsulation material and the encapsulation material ply angle.

It will be appreciated from the foregoing summary that the present invention provides an actuator/sensor package that is thermally stable and is, therefore, suitable for use in a variety of precision space applications. Use of the encapsulated actuator/sensor package of the invention permits precision structures to be designed with host structural members that are less stiff and are, therefore, of lower weight, volume and cost than similar members designed for high stiffness. Pointing and shaping accuracy is attained by use of the thermally stable, doubly encapsulated actuator/sensors, even when used on or in relatively compliant host structures. Other aspects and advantages of the invention will become apparent from the following more detailed description, taken in conjunction with the accompanying claims.

DESCRIPTION OF THE PREFERRED EMBODIMENT

Figure 1:
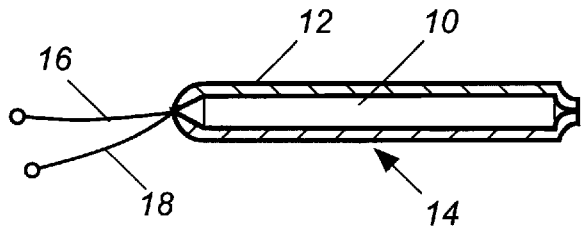
FIG. 1 is a cross-sectional view of an encapsulated actuator/sensor of the prior art.

As shown in the drawings for purposes of illustration, the present invention pertains to an actuator/sensor construction that has an effective zero or other desired value for a coefficient of thermal expansion (CTE). Actuator/sensor packages have in the past exhibited non-zero CTE values and have limited the precision of controllably deformable structures in environments such as space, where temperatures may vary widely.

In accordance with the present invention, a piezoelectric actuator or sensor is encapsulated, employing a fiber-reinforced composite material of which the material and lay-up angle are selected to provide a desired net CTE of zero, or a CTE that matches that of a host structural member, and a low stiffness needed to provide relatively high strain in the actuator/sensor.

As shown in the exploded view of FIG. 1, a piezoelectric actuator/sensor, referred to by reference numeral 10, is enclosed in a primary encapsulant 12. The actuator/sensor 10 is of a piezoelectric ceramic or electrostrictive material, such as lead zirconate titanate (ceramic) or lead magnesium niobate (PMN), and the primary encapsulating material may be, for example, a non-conductive fiber composite material, such as fiberglass cloth and a two-part room-temperature resin system as described, for example, in U.S. Pat. No. 5,305,507. The encapsulating material 12 and the device 10 it contains are cured as a unit at low temperature, typically room temperature. The curing procedure can be performed in a vacuum bag (not shown), to enable the extraction of unused resin and to produce a thin, flat actuator/sensor package 14, with electrical connection leads 16 and 18.

Figure 2:
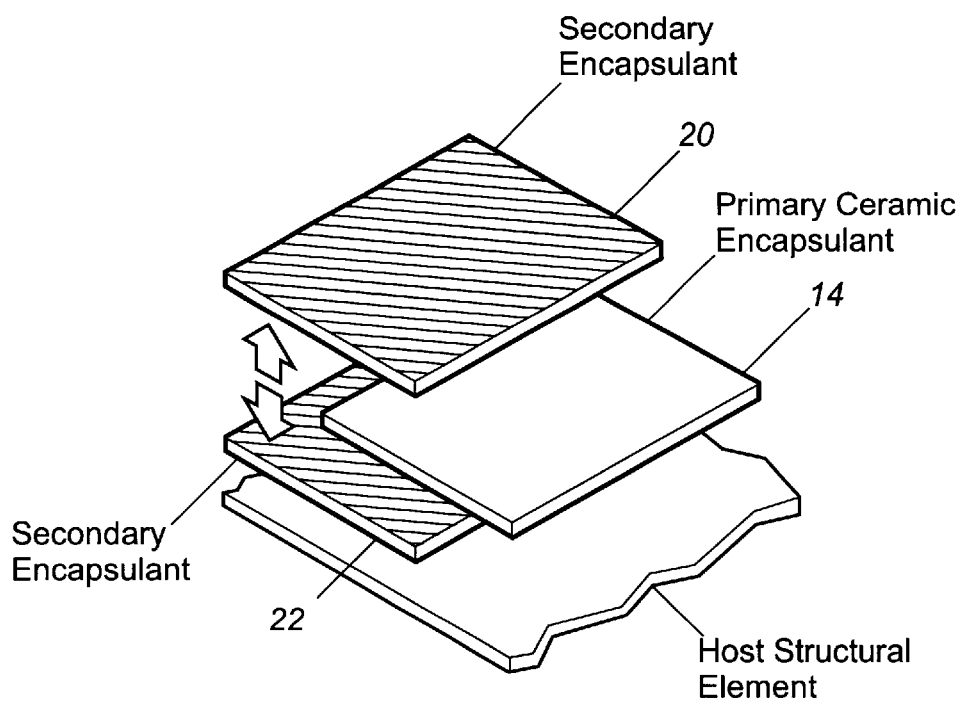
FIG. 2 is a diagrammatic three-dimensional view of an encapsulated actuator/sensor assembly in accordance with the present invention.

The primary encapsulation package 14 typically has a positive CTE but, in accordance with the present invention, is sandwiched between two cocured encapsulating layers 20 and 22 (FIG. 2) and is cocured in a single operation to produce a package with a selected CTE, which may be zero or matching the CTE of a host structural element. The doubly encapsulated package can be attached to the surface of the host structural element, or embedded in it, depending on the application of the device.

Selection and application of a fiber-reinforced composite material for the layers 20 and 22 presented a significant challenge for various reasons. First, the fiber-reinforced composite material must have significant compliance to facilitate strain-based actuation and sensing. Ceramic actuators and sensors are strain energy based devices. A ceramic actuator functions by transferring strain induced into it electrically, into the host structural element, and a ceramic sensor senses strain applied to it from the host structural element. Therefore, the fiber-reinforced composite material must not be so stiff that it inhibits deformation of the device 10 in its primary encapsulation package 14. The choice of fiber-reinforced composite material is further limited by a relationship that exists between the CTE and stiffness of suitable materials. Materials with a desirably low or negative CTE typically have a relatively high modulus of elasticity. The modulus is a measure of the stress needed to induce a unit measure of strain. Materials with a high modulus are said to be very stiff because large forces are needed to produce a given degree of deformation of strain. Accordingly, simply selecting a material of zero or negative CTE does not result in desirable performance properties because of the accompanying high stiffness of low CTE materials.

Figure 3:
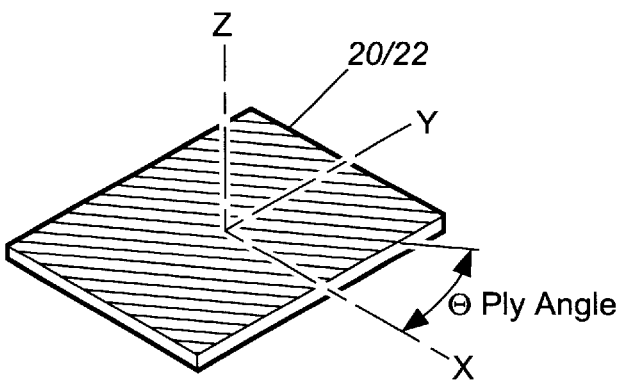
FIG. 3 is a diagrammatic three-dimensional view of a fiber-reinforced composite material, showing a ply lay-up angle with reference to X, Y and Z axes of the laminate.

In the device and method of the invention, the secondary layers 20 and 22 are applied to the primary encapsulation package 14 in plies of material such that a ply angle θ results in the desired stiffness properties. As shown in FIG. 3, the ply angle θ is the angle between the longitudinal direction of the laminate of encapsulation material, denoted by the X axis, and the fiber direction of the ply. The X axis is the desired direction of actuation. The plies are stronger in a direction along their lengths. Therefore, as the ply angle or lay-up angle increases, stiffness in the X-axis direction decreases. By appropriate selection of the material and the ply angle, the CTE and stiffness properties can be tailored as desired to provide a net zero or matching CTE and a selected minimal stiffness that results in desirable actuator and sensor performance.

Figure 4:
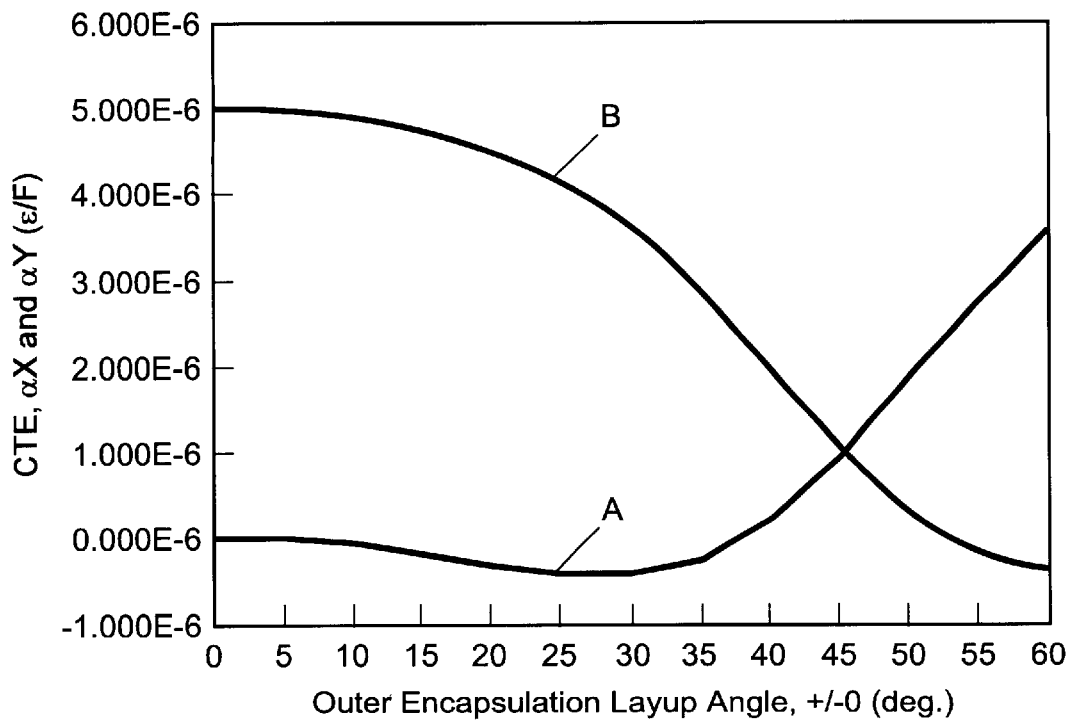
FIG. 4 is a graph showing the variation of coefficient of thermal expansion (CTE) in X- and Y-axis directions, with an outer or fiber-reinforced composite material lay-up angle, for one of the encapsulating materials.
Figure 5:
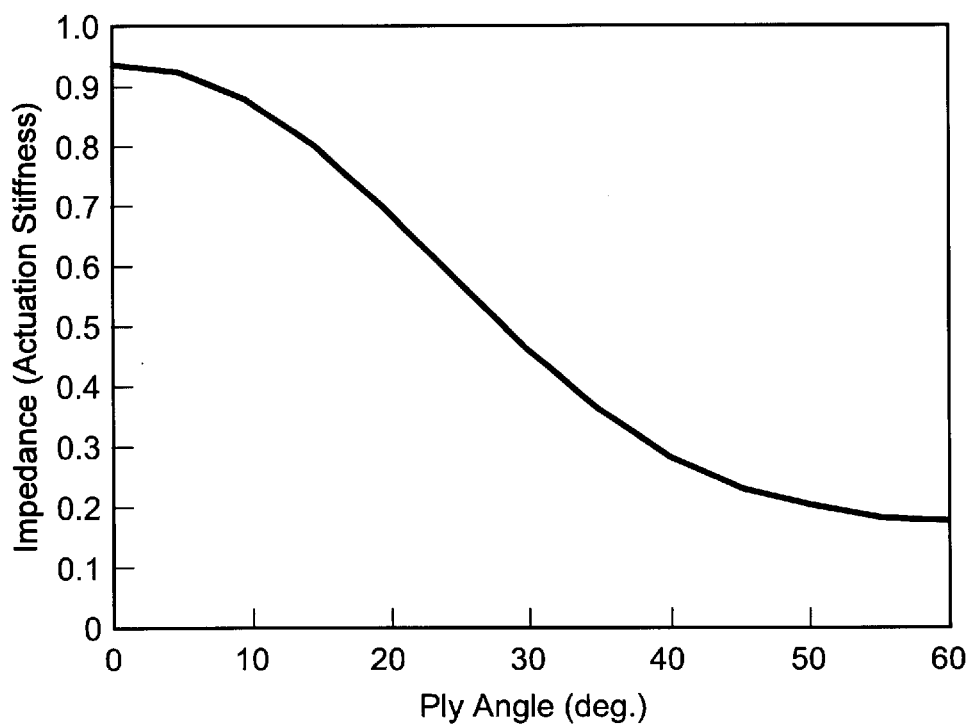
FIG. 5 is a graph showing the variation of encapsulation impedance (free strain per unit voltage divided by mechanical strain per unit load) with lay-up angle, for one of the encapsulating materials.

In one embodiment of the invention, the material used for fiber-reinforced composite material is a kevlar and resin system combination. In another embodiment, the fiber-reinforced composite material M55J/RS3, where M55J is a graphite fiber and RS3 is polycyanate resin system. This material takes the form of a tape of 0.005 inch (127 μm) thickness. The variation of properties with lay-up angle is shown in FIGS. 4, and 5. The two curves in FIG. 4 depict the variation of the net CTE for the X axis (curve A) and the Y axis (curve B), of the doubly encapsulated device, with the lay-up angle of the fiber-reinforced composite material. In particular, it is observed from FIG. 4 that the CTE measured in the X axis falls below zero for a range of lay-up angles of approximately 10–37 degrees, and then rises again as the angle is further increased. Thus, with appropriate selection of the secondary lay-up angle, a net zero CTE, or a CTE matching that of the host structural member 24, can be obtained.

As shown in FIG. 5, variation of the lay-up angle of the fiber-reinforced composite material also modifies the stiffness properties of the composite device. FIG. 5 depicts the variation of encapsulation impedance with lay-up angle, where encapsulation impedance is the ratio of actuator free strain for a unit voltage applied to its terminals, to encapsulation mechanical strain for a unit load. A lower value of this ratio indicates better actuation strength. As would be expected, the compliance of the composite device increases as the lay-up angle is increased, and the stiffness of the device decreases. For a lay-up angle of around 35 degrees, which provided a near-zero CTE, the stiffness of the composite device is desirably low.

The principles of the invention described above for a doubly encapsulated actuator/sensor are equally applicable to a single encapsulation technique. In this regard, FIG. 2 may also be viewed as depicting a primary encapsulation technique in accordance with the invention, wherein the structural element designated by, reference numeral 14 is an actuator/sensor, and the encapsulating layers 20 and 22 form a primary encapsulant for the actuator/sensor. In this embodiment of the invention, as in the doubly encapsulated embodiment, selection of a fiber-reinforced composite encapsulating material and selection of the material ply angle provide a desired net coefficient of thermal expansion (CTE) and a desired actuation strength or stiffness in the direction of strain. By appropriate selection of the material and ply angle, the CTE may be either minimized or matched to that of the host structure while simultaneously maximizing the actuation strength. The adhesive system of the encapsulating layers also provides strain relief to offset the brittleness of a ceramic actuator and functions to electrically isolate the actuator and its electrical leads.

It will be appreciated from the foregoing that the present invention represents a significant advance in stable structures for use in space. In particular, the invention provides a technique for increasing the thermal stability of piezoelectric actuators and sensors, by single or double encapsulation of the actuator/sensors in such a way as to reduce the coefficient of thermal expansion to near zero, or to a value matching that of a host structural member. Although an embodiment of the invention has been described in detail for purposes of illustration, various modifications may be made without departing from the spirit and scope of the invention. Accordingly, the invention should not be limited except as by the appended claims.

What is claimed is:

1. A doubly encapsulated actuator/sensor package, comprising:

an actuator/sensor having wire leads connected to electrodes of the actuator/sensor;

a primary encapsulating material surrounding the actuator/sensor except for the wire leads, which extend through the primary encapsulating material; and a fiber-reinforced composite material surrounding the primary encapsulating material and comprising multiple plies of a fiber-reinforced material applied to the primary encapsulating material at selected ply angles;

wherein the fiber-reinforced composite material and the ply angles are selected to provide a desired net coefficient of thermal expansion and a desired stiffness with respect to a selected axis;

and wherein the primary and fiber-reinforced composite materials and the fiber-reinforced composite material ply angles are selected to provide a coefficient of thermal expansion of approximately zero;

and wherein the selected fiber-reinforced composite material and ply angles also result in a composite structure of relatively low stiffness, to provide desirably high actuator force and sensor signal strength.

2. A doubly encapsulated actuator/sensor package as defined in claim 1, wherein:

the actuator/sensor is selected from the group consisting of piezoelectric and electrostrictive materials;

the primary encapsulating material is a non-conductive fiber composite material and a resin system; and the fiber-reinforced composite material is a resin system resin combination.

3. A doubly encapsulated actuator/sensor package as defined in claim 2, wherein:

the ply angle is measured with respect to a selected actuation axis.

4. A doubly encapsulated actuator/sensor package, comprising:

an actuator/sensor having wire leads connected to electrodes of the actuator/sensor;

a primary encapsulating material surrounding the actuator/sensor except for the wire leads, which extend through the primary encapsulating material; and a fiber-reinforced composite material surrounding the primary encapsulating material and comprising multiple plies of a fiber-reinforced material applied to the primary encapsulating material at selected ply angles;

wherein the fiber-reinforced composite material and the ply angles are selected to provide a desired net coefficient of thermal expansion and a desired stiffness with respect to a selected axis;

and wherein the primary and fiber-reinforced composite materials and the fiber-reinforced composite material ply angles are selected to provide a coefficient of thermal expansion matching a specific structural material in which the package is to be adhered or imbedded;

and wherein the selected fiber-reinforced composite material and ply angles also result in a composite laminate of relatively low stiffness, to provide desirably high actuator force and sensor signal strength.

5. A doubly encapsulated actuator/sensor package as defined in claim 3, wherein:

the actuator/sensor is selectd from the group consisting of piezoelectric and electrostrictive materials;

the primary encapsulating material is a non-conductive fiber composite material and a resin system; and the fiber-reinforced composite material is a resin system resin combination.

6. A doubly encapsulated actuator/sensor package as defined in claim 5, wherein:

the ply angle is measured with respect to an axis in which strain occurs in the actuator/sensor package when in use.

7. An encapsulated actuator/sensor package, comprising:

an actuator/sensor having wire leads connected to electrodes of the actuator/sensor; and an encapsulating material surrounding the actuator/sensor and comprising multiple plies of a fiber-reinforced composite material applied to the actuator/sensor at selected ply angles;

wherein the fiber-reinforced composite material and the ply angles are selected to provide a desired net coefficient of thermal expansion and a desired stiffness with respect to a selected axis;

and wherein the fiber-reinforced composite material and the ply angles are selected to provide a coefficient of thermal expansion of approximately zero;

and wherein the selected ply angles also result in a composite structure of relatively low stiffness, to provide desirably high actuator force and sensor signal strength.

8. An encapsulated actuator/sensor package as defined in claim 7, wherein:

the actuator/sensor is selected from the group consisting of piezoelectric and electrostrictive materials.

9. An encapsulated actuator/sensor package, comprising:

an actuator/sensor having wire leads connected to electrodes of the actuator/sensor; and an encapsulating material surrounding the actuator/sensor and comprising muiltiple plies of a fiber-reinforced composite material applied to the actuator/sensor ply angles;

wherein the fiber-reinforced composite material and the ply angles are selected to provide a desired net coefficent of thermal expansion and a desired stiffness with respect to a selected axis;

and wherein the firber-reinforced composite material and the ply angles are selected to provide a coefficient oif thermal expansion matching a specific structural material in which the package is to be adhered or imbedded;

and wherein the selected fiber-reinforced composite material and ply angles also result in a composite laminate of relatively low stiffness, to provide desirably high actuator force and a sensor signal strength.

10. An encapsulated actuator/sensor package as defined in claim 9, wherein:

the actuator/sensor is selected from the group consisting of piezoelectric and electrostrictive materials.

* * * * *